(12) United States Patent
See et al.

(10) Patent No.: US 11,355,358 B2
(45) Date of Patent: Jun. 7, 2022

(54) METHODS OF THINNING SILICON ON EPOXY MOLD COMPOUND FOR RADIO FREQUENCY (RF) APPLICATIONS

(71) Applicant: APPLIED MATERIALS, INC., Santa Clara, CA (US)

(72) Inventors: Guan Huei See, Singapore (SG); Prayudi Lianto, Singapore (SG); Yu Gu, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 125 days.

(21) Appl. No.: 16/579,723

(22) Filed: Sep. 23, 2019

(65) Prior Publication Data
US 2021/0090905 A1 Mar. 25, 2021

Related U.S. Application Data

(60) Provisional application No. 62/735,581, filed on Sep. 24, 2018.

(51) Int. Cl.
*H01L 21/56* (2006.01)
*H01L 21/3105* (2006.01)

(52) U.S. Cl.
CPC ...... *H01L 21/561* (2013.01); *H01L 21/31058* (2013.01)

(58) Field of Classification Search
CPC ....... H01L 2924/00014; H01L 2924/00; H01L 24/19; H01L 2224/97; H01L 2224/04105; H01L 24/20; H01L 24/96; H01L 21/78; H01L 21/304; H01L 2224/11; H01L 2224/19; H01L 2224/94; H01L 24/97; H01L 2224/73267; H01L 2224/12105; H01L 23/3114

See application file for complete search history.

(56) References Cited

U.S. PATENT DOCUMENTS

| | | | |
|---|---|---|---|
| 5,374,564 A | 12/1994 | Bruel | |
| 7,338,882 B2 | 3/2008 | Park et al. | |
| 7,986,042 B2 | 7/2011 | Or-Bach et al. | |
| 8,153,499 B2 | 4/2012 | Or-Bach et al. | |
| 8,778,733 B2 * | 7/2014 | Fuergut | H01L 24/19 438/107 |
| 9,704,824 B2 | 7/2017 | Lin et al. | |
| 2013/0241077 A1 * | 9/2013 | Fuergut | H01L 23/5389 257/774 |

* cited by examiner

*Primary Examiner* — Jaehwan Oh
(74) *Attorney, Agent, or Firm* — Moser Taboada

(57) ABSTRACT

Embodiments of methods for processing a semiconductor substrate are described herein. In some embodiments, a method of processing a semiconductor substrate includes removing material from a backside of a reconstituted substrate having a plurality of dies to expose at least one die of the plurality of dies; etching the backside of the reconstituted substrate to remove material from the exposed at least one die; and depositing a first layer of material on the backside of the reconstituted substrate and the exposed at least one die.

19 Claims, 6 Drawing Sheets

METHODS OF THINNING SILICON ON EPOXY MOLD COMPOUND FOR RADIO FREQUENCY (RF) APPLICATIONS

CROSS-REFERENCE TO RELATED APPLICATIONS

This application claims benefit of U.S. provisional patent application Ser. No. 62/735,581, filed Sep. 24, 2018 which is herein incorporated by reference in its entirety.

FIELD

Embodiments of the present principles generally relate to semiconductor processes used in packaging semiconductor devices.

BACKGROUND

A semiconductor substrate is processed to form structures on the substrate surface. The structures on a particular region of the substrate can be linked together to form a microcircuit. The substrate may have many different microcircuits constructed on the substrate's surface during processing. Once the substrate has finished being processed, the substrate is cut apart or singulated to separate the microcircuits into semiconductor 'chips', or dies. The chips often contain complex circuitry which needs to interact with external components. The chip's internal circuitry is too minute to be connected directly to the external components. To overcome the external connection issues, lead outs are formed that are connected to the internal circuitry of a chip to a pad or solder ball that allows for external connections. The lead outs are formed in what is known as a 'redistribution layer' during follow-on package processing of the semiconductor chips. Chips from different substrates may be combined together by placing the chips on a surface and pouring a molding compound over the chips to again form a new substrate, also referred to as a reconstituted substrate.

The inventors have observed that the thickness of the chips within the reconstituted substrate may be too great for certain applications that require lighter and more compact chips. Thus, the inventors have provided an improved method for reducing the thickness of chips in substrate level packaging.

SUMMARY

Embodiments of methods for processing a semiconductor substrate are described herein. In some embodiments, a method of processing a semiconductor substrate includes removing material from a backside of a reconstituted substrate having a plurality of dies to expose at least one die of the plurality of dies; etching the backside of the reconstituted substrate to remove material from the exposed at least one die; and depositing a first layer of material on the backside of the reconstituted substrate and the exposed at least one die.

In some embodiments, a method of processing a semiconductor substrate includes overmolding a non-active side of a first die and a second die to form a reconstituted substrate having a first side and a second side, wherein an active side of the first die and the second die face the second side, chemical-mechanical planarizing the first side of the reconstituted substrate to expose at least one of the first die and the second die, etching the first side of the reconstituted substrate to reduce a thickness of at least one of the first die and the second die, and depositing a first layer of material on the first side of the reconstituted substrate and the etched at least one of the first die and the second die.

In some embodiments, a non-transitory computer readable medium for storing computer instructions that, when executed by at least one processor causes the at least one processor to perform a method includes removing material from a backside of a reconstituted substrate having a plurality of dies to expose at least one die of the plurality of dies; etching the backside of the reconstituted substrate to remove material from the exposed at least one die; and depositing a first layer of material on the backside of the reconstituted substrate and the exposed at least one die.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate some embodiments of the disclosure and are therefore not to be considered limiting of scope, for the disclosure may admit to other equally effective embodiments.

Figure 1A:
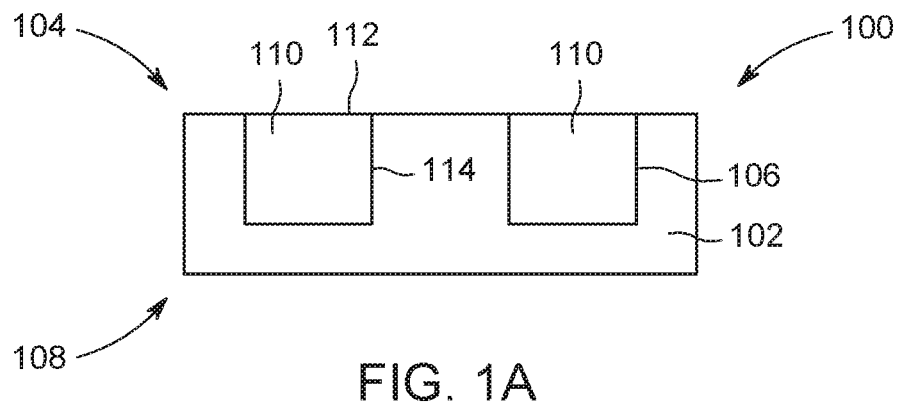
FIGS. 1A-1D respectively depict stages of a process to create a thinner die embedded in substrate level packaging in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A substrate is used to form semiconductor structures through deposition, etching, and electroplating, etc. Such structures are generally formed across the surface of the substrate in a grid pattern with groupings of several of the structures together forming a chip, or die. As such, the substrate includes many dies arranged on the substrate. The substrate is cut apart (e.g., singulated) into individual dies. In some embodiments, one or more dies (from the same substrate and/or other singulated substrate) are placed on a new substrate. The one or more dies are placed in such a way on the new substrate that an active side of each of the dies is oriented down (e.g., face, or active side, down). The active side of each of the dies includes circuitry formed thereon. The non-active side of each of the dies does not have any circuitry formed thereon.

In some embodiments, the dies are spaced apart to allow room for lead outs to be formed during subsequent redistribution layer (RDL) formation. The spacing allows for the lead outs to fan outwardly from the die, and the process to accomplish the lead out spacing is usually referred to as fan-out wafer-level packaging (FOWLP). An overmolding compound is then poured over the active side down dies. The overmolding compound generally covers the entire backside of the dies. When the overmolding compound is cured, the overmolding compound is released from the new substrate forming a reconstituted substrate. In some embodiments, the overmolding compound provides an insulating matrix. In some embodiments, the reconstituted substrate is then oriented (e.g., flipped over) to expose the active sides of the dies and perform any subsequent processing. In some embodiments, once the overmolding compound is cured, a copper RDL interconnect process is performed (e.g., a mold-first RDL process). In some embodiments, a copper RDL interconnect process is performed prior to pouring the overmolding compound over the dies (e.g., an RDL-first process).

FIGS. 1A-1D respectively depict stages of a process to create a thinner die embedded in substrate level packaging in accordance with some embodiments of the present principles. FIG. 1A depicts a cross section of a portion of a reconstituted substrate 100 and a plurality of dies 110 (two shown). The reconstituted substrate 100 has a first side 108, also referred to as a backside, and a second side 104, opposite the first side 108. The plurality of dies 110 are embedded in an overmolding 102 of the reconstituted substrate 100. Each die of the plurality of dies 110 lie within a recess 106 of the overmolding 102. Each of the plurality of dies 110 has a first side 114 and a second side 112, opposite the first side 114. The first side 114 corresponds with a non-active side of the die 110. The second side 112 corresponds with an active side of the die 110. In some embodiments, the second side 112 of the plurality of dies 110 is coplanar with the second side 104 of the reconstituted substrate 100.

Figure 1B:
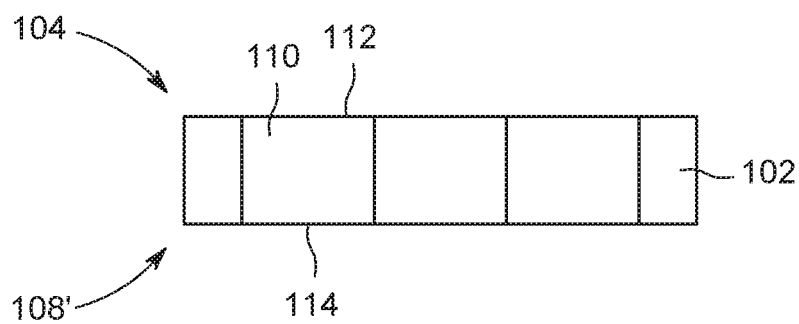

FIG. 1B depicts the plurality of dies 110 and the reconstituted substrate 100 after a layer of material of the overmolding 102 is removed from the first side 108 of the reconstituted substrate 100. In some embodiments, the layer of material is removed via a backgrinding process. In some embodiments, the layer of material is removed via a planarization process, such as chemical-mechanical planarization (CMP). In some embodiments, as shown in FIG. 1B, a layer of material is removed to expose the first side 114, or non-active side, of each of the plurality of dies 110. After the layer of material is removed, the reconstituted substrate 100 has a first side 108'.

Figure 1C:
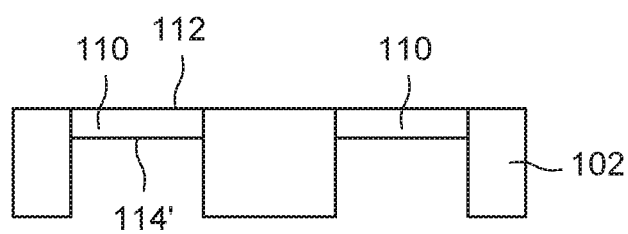

FIG. 1C depicts the plurality of dies 110 and the reconstituted substrate 100 after an etching process is performed on the first side 108 of the reconstituted substrate 100 and the first side 114 that is exposed of each of the plurality of dies 110. In some embodiments, the etching process comprises a dry etch process using process gases, for example, sulfur hexafluoride ($SF_6$) plasma. In some embodiments, the etching process comprises a wet etch process using process gases, for example, wet tetramethylammonium hydroxide (TMAH) or quaternary ammonium hydroxide (QAH). The etching process is configured to remove material from the first side 114 of each of the plurality of dies 110 (e.g., recess the plurality of dies 110 toward the second side 112). For example, the reconstituted substrate 100 may be placed in a vacuum chamber at a suitable pressure and at a suitable temperature. The process gases mentioned above can be introduced into the vacuum chamber. RF power can be provided to the vacuum chamber to strike a plasma and the substrate is subsequently plasma etched for a suitable period of time to remove material from each of the dies 110 that are exposed, for example, until a desired thickness of the dies 110 is obtained. Each of the dies 110 that are exposed may be etched to a desired thickness while little or no material is removed from the overmold 102 that is exposed to the plasma. In some embodiments, the desired thickness, or the distance from the first side 114 to the second side 112' (e.g., final thickness) of each of the etched plurality of dies 110 is less than about 5.0 micrometers.

Figure 1D:
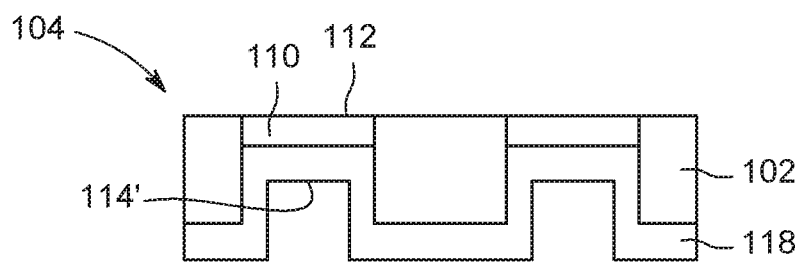

FIG. 1D depicts the plurality of dies 110 and the reconstituted substrate 100 after a first layer 118 of material is deposited on the first side 108' of the reconstituted substrate and the exposed dies of the plurality of dies 110. In some embodiments, the first layer 118 is a passivation layer. In some embodiments, the first layer 118 is a dielectric layer. In some embodiments, the first layer 118 comprises a polymer or epoxy layer such as a backside coated polymer or epoxy layer, a sprayed polymer or epoxy layer, a laminated polymer or epoxy layer, or the like. In some embodiments, the first layer 118 is applied via spin coating or spraying. In some embodiments, the polymer layer is formed of an organic material, such as polyimide or p-phenylene benzobisoxazole. In some embodiments, the first layer 118 is deposited via a chemical vapor deposition (CVD) process. In some embodiments, the first layer 118 comprises an oxide layer or inorganic layer, such as silicon oxide (SiO), a nitride layer, such as silicon nitride (SiN), or any other suitable inorganic material. The first layer 118 is configured to protect each of the plurality of dies 110. In some embodiments, the first layer 118 has a uniform thickness. In some embodiments, the first layer 118 has a uniform thickness and is deposited conformally atop the first side 108' of the reconstituted substrate 100, within the recesses formed in the overmolding 102, and atop the exposed dies of the plurality of dies 110.

Once the first layer 118 is formed, the reconstituted substrate 100 can undergo subsequent processing, packaging, and singulation. For example, in some embodiments, the subsequent processing includes a wet/dry cleaning step, such as a deionized water/solvent clean or a plasma clean. In some embodiments, the subsequent processing includes lithography for a polymer layer applied on the second side 104 of the reconstituted substrate 100. In some embodiments, the subsequent processing includes forming a RDL layer on the reconstituted substrate 100.

Figure 2:
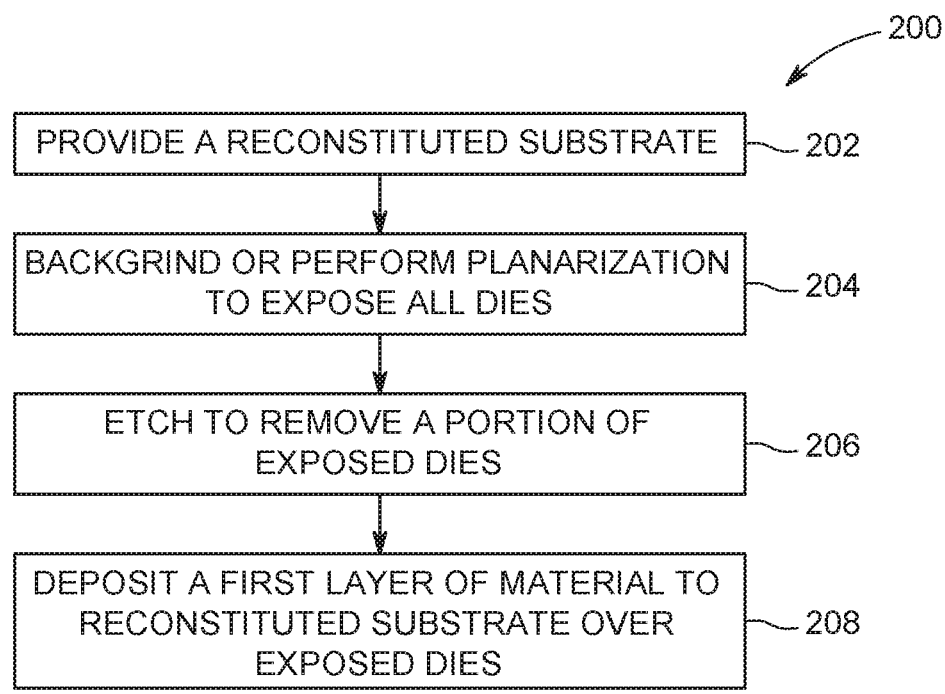
FIG. 2 is a flow chart of the process depicted in FIG. 1.

FIG. 2 is a flow chart of a method 200 showing the process depicted in FIGS. 1A-1D. The method 200 starts at 202 by providing a reconstituted substrate 100. In some embodiments, the reconstituted substrate 100 can be formed by overmolding a plurality of dies 110 with an overmolding 102 to create the reconstituted substrate 100. The plurality of dies 110 are picked and placed from, for example, one or more singulated substrates. The plurality of dies 110 may come from different substrates and may be of varying sizes and thicknesses. The overmolding compound is poured over the first side 114 (non-active side) of the dies while the active side of the dies is facing down. In some embodiments, a carrier can used to provide rigidity of the reconstituted substrate during subsequent processing.

At 204, a backgrinding or planarization process is then performed to expose non-active sides, or the first sides 114, of the plurality of dies 110. The backgrinding or planarization process removes a layer of material from the reconstituted substrate 100. The planarization process can include CMP, and/or other process to planarize the reconstituted substrate. Planarization processes are typically performed at room temperature (approximately 15 degrees Celsius to approximately 30 degrees Celsius). The planarization process temperature can be increased and is bounded only by temperature limitations of the overmolding compound.

At 206, an etching process is then performed to remove a portion of the dies 110 that are exposed. The etching process, as described above, may be a wet process or a dry process. The etching process reduces the thickness of the dies 110 and recesses the dies 110 from the overmolding 102.

At 208, a first layer 118 of material is then deposited on the reconstituted substrate 100 and the exposed dies 110. In some embodiments, the first layer 118 may be a protective film coating. The protective film coating can be a polymer-based material or other material. In some embodiments, the first layer may be a deposited via a CVD tool and the like. In some embodiments, as described above the first layer may be an oxide layer or a nitride layer deposited via the CVD tool.

Figure 3A:
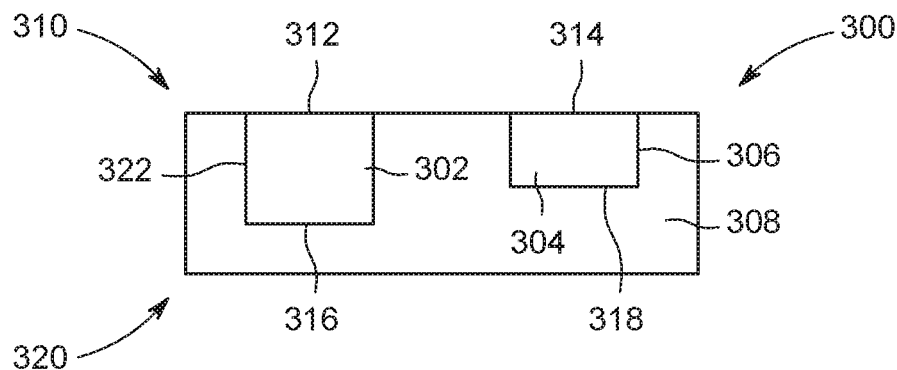
FIGS. 3A-3D respectively depict stages of a process to create a thinner die embedded in substrate level packaging in accordance with some embodiments of the present principles.

FIGS. 3A-3D respectively depict stages of a process to create a thinner die embedded in substrate level packaging in accordance with some embodiments of the present principles. FIG. 3A depicts a cross section of a portion of a reconstituted substrate 300 and a plurality of dies (two shown). The plurality of dies includes a first die 302 and a second die 304. The first die 302 has a thickness greater than a thickness of the second die 304. The reconstituted substrate 300 has a first side 320 and a second side 310. The first die 302 and the second die 304 are embedded in an overmolding 308 of the reconstituted substrate 300. The first die 302 has a first side 316 (non-active side) and a second side 312 (active side). The first die 302 is disposed within a recess 322 of the overmolding 308. The second die 304 has a first side 318 (non-active side) and a second side 314 (active side). The second die 304 is disposed within a recess 306 of the overmolding 308. In some embodiments, the second side 312 of the first die 302 and the second side 314 of the second die 304 are coplanar with the second side 310 of the reconstituted substrate 300.

Figure 3B:
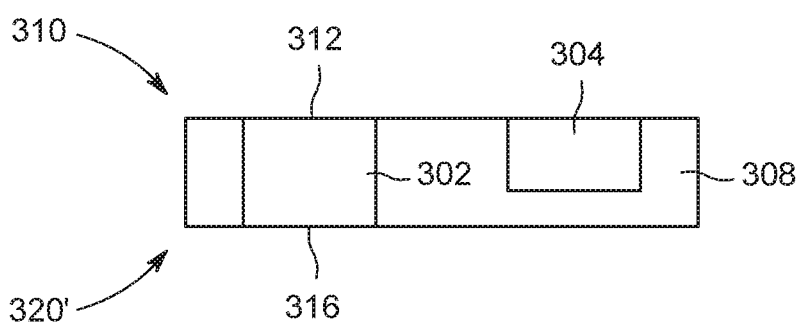

FIG. 3B depicts the plurality of dies 302, 304 and the reconstituted substrate 300 after a layer of material of the overmolding 308 is removed from the first side 320 of the reconstituted substrate 300. In some embodiments, the layer of material is removed via a backgrinding process. In some embodiments, the layer of material is removed via a planarization process, such as CMP. After the layer of material is removed, the reconstituted substrate 300 has a first side 320'. In some embodiments, as shown in FIG. 3B, the layer of material is removed to expose the second side 312, or non-active side, of the first die 302, while the second die 304 is not exposed.

Figure 3C:
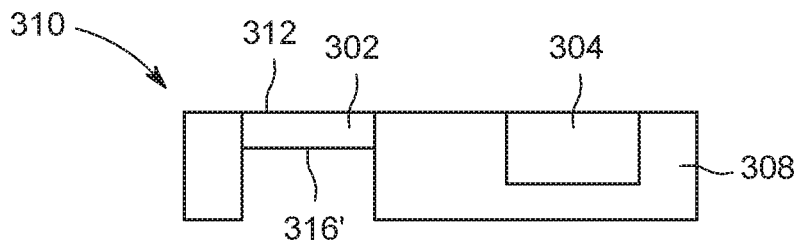
Figure 3D:
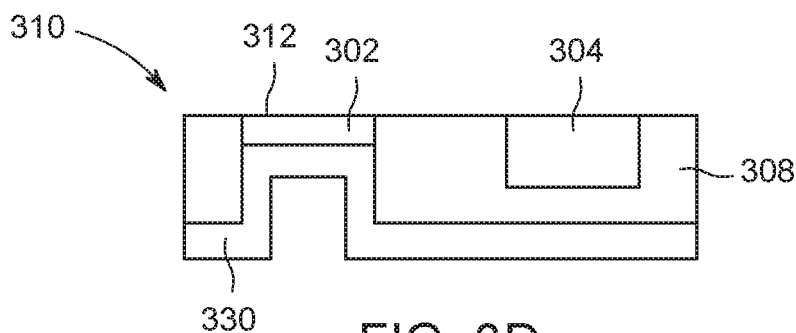

FIG. 3C depicts the plurality of dies 302, 304 and the reconstituted substrate 300 after an etching process is performed on the first side 320' of the reconstituted substrate 300 and the second side 312 of the first die 302. In some embodiments, the etching process comprises the same materials and techniques as described above. In some embodiments, the final thickness of the first die 302 is less than about 0.1 micrometers. FIG. 3D depicts the plurality of dies 302, 304 and the reconstituted substrate 300 after a first layer 330 of material is deposited on the first side 320' of the reconstituted substrate 300 and the second side 316' of the first die 302. In some embodiments, the first layer 330 is similar to first layer 118.

Figure 4:
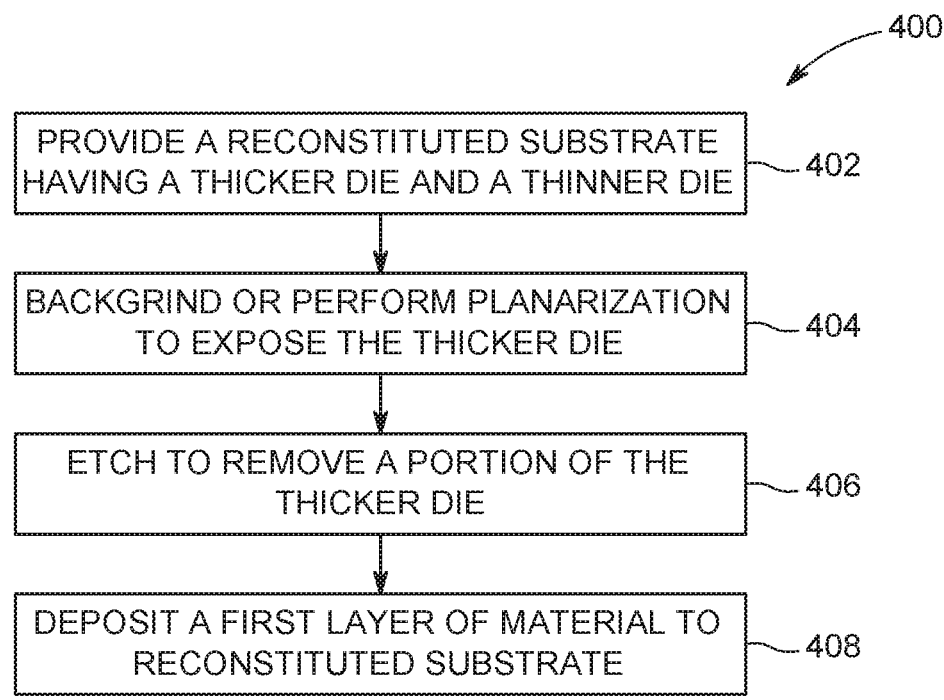
FIG. 4 is a flow chart of the process depicted in FIG. 3.

FIG. 4 is a flow chart of a method showing the process depicted in FIGS. 3A-3D. The method 400 starts at 402 by providing a reconstituted substrate 300 having a thicker die 302 and a thinner die 302. The dies 302, 304 are picked and placed from, for example, one or more singulated substrates. The overmolding compound is poured over the first side 316, 318 (non-active side) of the dies 302, 304 while the active side of the dies is facing down. In some embodiments, a carrier can used to provide rigidity of the reconstituted substrate during subsequent processing.

Figure 5A:
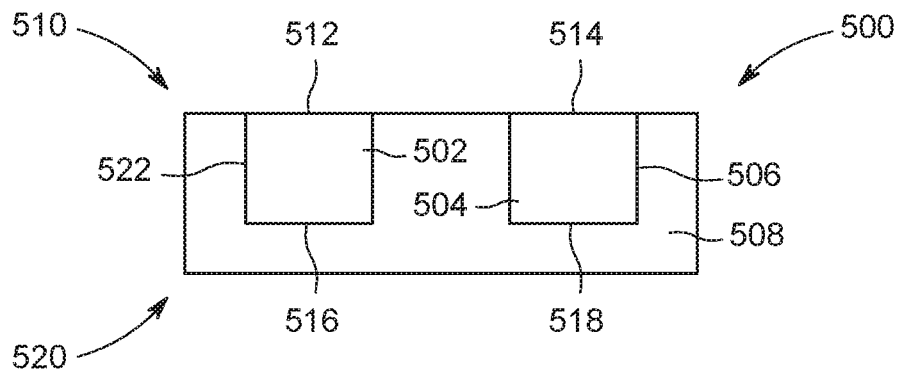
FIGS. 5A-5E respectively depict stages of a process to create a thinner die embedded in substrate level packaging in accordance with some embodiments of the present principles.

At 404, a backgrinding or planarization process is then performed to expose the first side 316 (non-active side) of the thicker die 302. The backgrinding or planarization process removes a layer of material from the reconstituted substrate 300. As described above, the planarization process can include CMP, and/or other process to planarize the reconstituted substrate 300. At 406, an etching process is then performed to remove a portion of the exposed thicker die 302. The etching process may be similar to as describe above. At 408, a first layer 330 of material is then deposited on the reconstituted substrate 300 and the exposed die 302. The first layer of material may be deposited similar to as described above FIGS. 5A-5E respectively depict stages of a process to create a thinner die embedded in substrate level packaging in accordance with some embodiments of the present principles. FIG. 5A depicts a cross section of a portion of a reconstituted substrate 500 and a plurality of dies (two shown). The plurality of dies includes a first die 502 and a second die 504. The first die 502 has a starting thickness greater that is similar to or the same as a thickness of the second die 504. The reconstituted substrate 500 has a first side 520 and a second side 510. The first die 502 and the second die 504 are embedded in an overmolding 508 of the reconstituted substrate 500. The first die 502 has a first side 516 (non-active side) and a second side 512 (active side). The first die 502 is disposed within a recess 522 of the overmolding 508. The second die 504 has a first side 518 (non-active side) and a second side 514 (active side). The second die 504 is disposed within a recess 506 of the overmolding 508. In some embodiments, the second side 512 of the first die 502 and the second side 514 of the second die 504 are coplanar with the second side 510 of the reconstituted substrate 500.

Figure 5B:
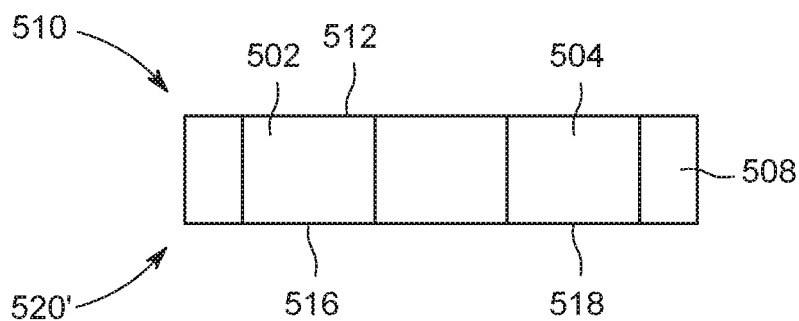

FIG. 5B depicts the plurality of dies 502, 504 and the reconstituted substrate 500 after a layer of material of the overmolding 508 is removed from the first side 520 of the reconstituted substrate 500. In some embodiments, the layer of material is removed via a backgrinding process. In some embodiments, the layer of material is removed via a planarization process, such as CMP. After the layer of material is removed, the reconstituted substrate 500 has a first side 520'. In some embodiments, as shown in FIG. 5B, the layer of material is removed to expose both the first side 516 of the first die 502 and the first side 518 of the second die 504.

Figure 5C:
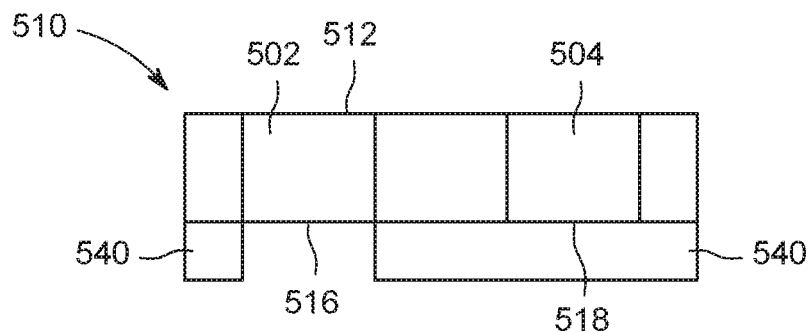

FIG. 5C depicts the plurality of dies 502, 504 and the reconstituted substrate 500 after depositing a second layer 540 of material on the first side 520' of the reconstituted substrate 500 and at least one exposed die. As shown in FIG. 5C, the second layer 540 is deposited on the second die 504. In some embodiments, the second layer 540 is a patterned masking layer. In some embodiments, the second layer 540 is a patterned masking layer that exposes the first die 502 while covering the second die 504. In some embodiments, the second layer 540 is deposited using any suitable masking technique, for example, positive photoresist, negative photoresist, hard mask layer deposited via CVD, or the like.

Figure 5D:
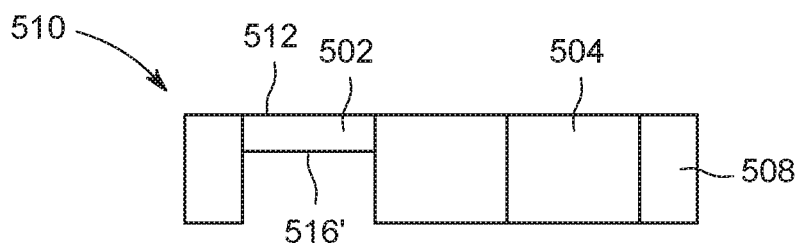
Figure 5E:
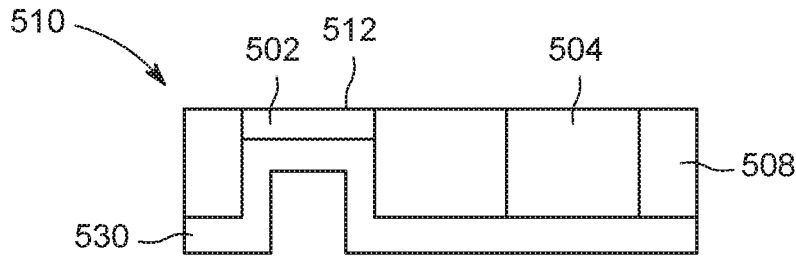

FIG. 5D depicts the plurality of dies 502, 504 and the reconstituted substrate 500 after an etching process is performed on the first side 516 of the first die 502. In some embodiments, the etching process comprises the same materials and techniques as described above. The final thickness of the first die 502 is less than the final thickness of the second die 504. In some embodiments, the final thickness of the first die 502 is less than about 0.1 micrometers. FIG. 5E depicts the plurality of dies 502, 504 and the reconstituted substrate 500 after a first layer 530 of material is deposited on the first side 520' of the reconstituted substrate 500 and the plurality of dies 502, 504. In some embodiments, the first layer 530 is similar to first layers 118, 330.

Figure 6:
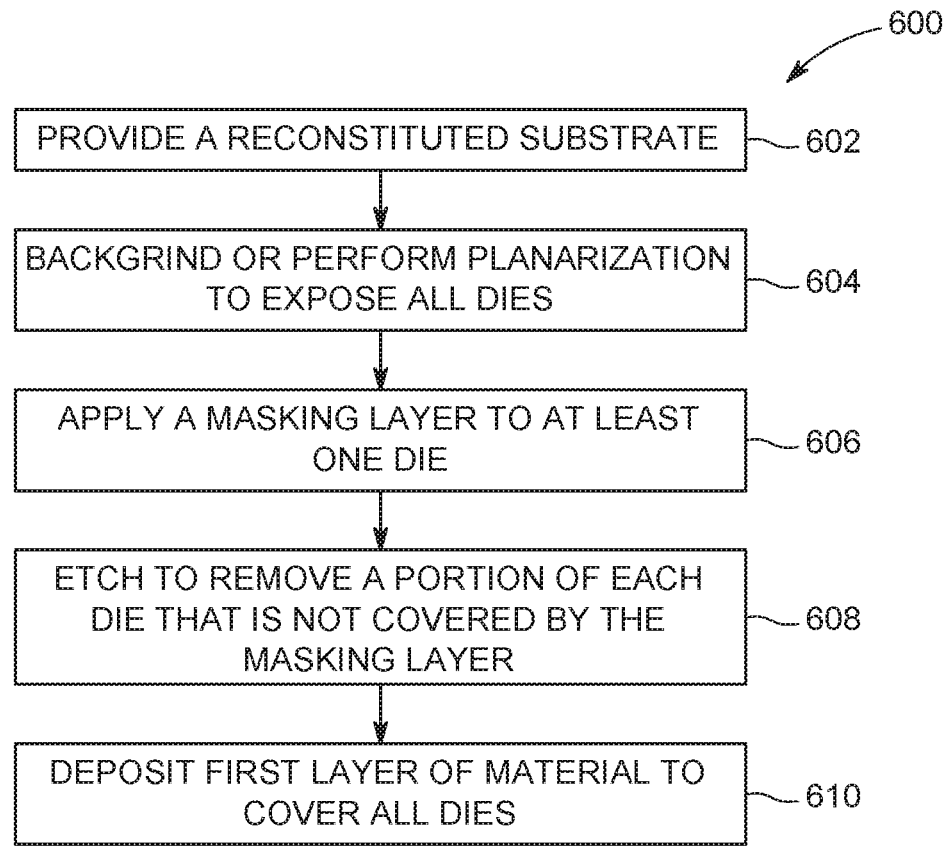
FIG. 6 is a flow chart of the process depicted in FIG. 5.

FIG. 6 is a flow chart of a method 600 showing the process depicted in FIGS. 5A-5E. The method 600 starts at 602 by providing a reconstituted substrate 500 having a plurality of dies 502, 504 of similar thickness. The dies 502, 504 are picked and placed from, for example, one or more singulated substrates. Overmolding compound is poured over the first side 516, 518 (non-active side) of the dies 502, 504 while the second side 512, 514 (active side) of the dies 502, 504 is facing down. In some embodiments, a carrier can used to provide rigidity of the reconstituted substrate during subsequent processing.

At 604, a backgrinding or planarization process is then performed to expose the first sides 516, 518 of the dies 502, 504. The backgrinding or planarization process removes a layer of material from the reconstituted substrate 500. As described above, the planarization process can include CMP, and/or other process to planarize the reconstituted substrate 500. At 606, a masking layer, or a second layer 540, is then applied to at least one die 606. The masking layer comprises a patterned masking layer that exposes at least one die 502 while covering at least one additional die 504 of the plurality of dies 502, 504. At 608, an etching process is then performed to remove a portion of each die that is not covered by the masking layer. The etching process may be similar to as describe above. At 610, a first layer 530 of material is then deposited on the reconstituted substrate 500 and all of the dies 502, 504. The first layer 530 be deposited similar to as described above The methods described herein advantageously facilitate fabrication of thin dies embedded in insulating matrix to enable silicon-on-insulator ("SOI") devices without using expensive SOI substrates. The methods described herein also advantageously facilitate integration of multiple dies with different thicknesses to enable system level integration, for example, for different RF devices (e.g., thinner die for RF switches and thicker die for power amplifier). The methods described herein further advantageously lower parasitic capacitance, provide resistance to latchup, provide higher performance at equivalent VDD, reduce temperature dependency due to no doping, reduce antenna issues, lower leakage currents due to isolation, and is resistant to soft errors (inherently radiation hardened).

Figure 7:
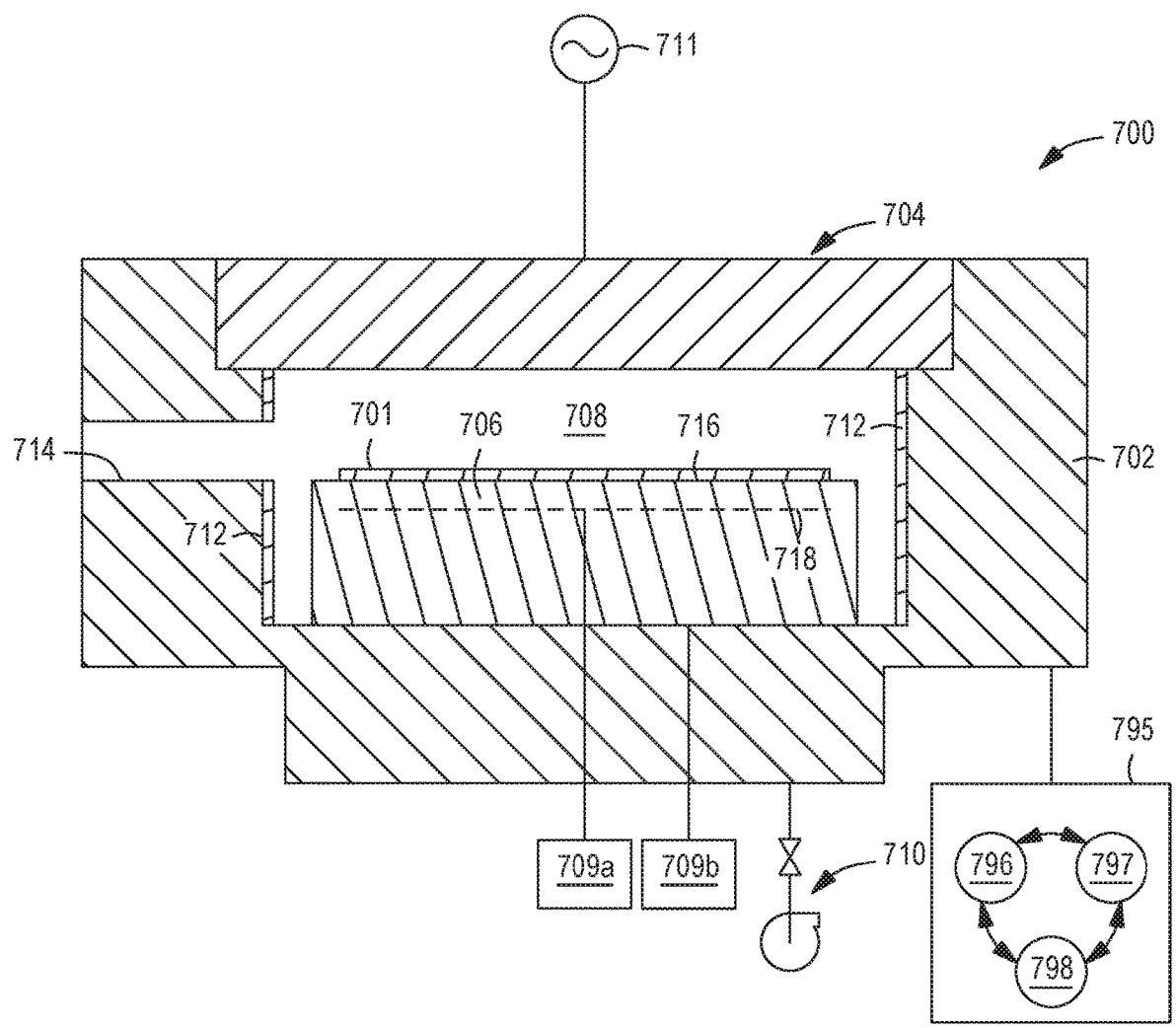
FIG. 7 depicts a schematic cross-sectional view of a process chamber in accordance with some embodiments of the present principles.

The methods described herein may be performed in one or more multi-chamber processing tools in one or more stand-alone process chambers, or combinations thereof. In some embodiments, the multi-chamber processing tool includes multiple process chambers mounted on a vacuum transfer chamber. In some embodiments, the process chamber includes a housing with multiple processing portions for performing the various processes of the methods described herein. Examples of multi-chamber processing tools or process chambers which benefit from aspects described herein are available from Applied Materials, Inc., located in Santa Clara, Calif. Other process chambers, including non-etching chambers and chambers from other manufacturers, may be adapted to benefit from aspects of the present principles. For example, FIG. 7 is a simplified schematic cross-sectional view of a process chamber 700 in which embodiments of the present methods may be implemented. The process chamber 700 is any chamber suitable for etching and depositing materials onto a substrate, such as substrate 701. In some embodiments, the process chamber 700 includes a chamber body 702, a gas distribution plate assembly 704, and a substrate support 706. The chamber body 702 of the process chamber 700 includes or may be formed from one or more process compatible materials. In some embodiments, the process chamber 700 includes a liner 712 coupled to the chamber body 702.

The substrate support 706 functions as an electrode in conjunction with the gas distribution plate assembly 704. As such, a plasma may be formed in a processing volume 708 defined between the gas distribution plate assembly 704 and an upper surface 716 of the substrate support 706 to deposit or remove material from the substrate 701. The chamber body 702 is also coupled to a vacuum system 710 that includes a pump and a valve. The chamber body 702 includes a port 714 formed in a sidewall thereof. The port 714 is selectively opened and closed to allow the substrate 701 to access to the interior of the chamber body 702 by a substrate handling robot (not shown).

A power source 711, such as an RF power source, is coupled to the gas distribution plate assembly 704 to electrically bias the gas distribution plate assembly 704 relative to the substrate support 706 to facilitate plasma generation within the process chamber 700. The power source 711 may operate over a wide range of frequencies dependent on a given process.

The substrate support 706 includes an electrostatic chuck 718, in which the electrostatic chuck 718 may be connected to a power source 709a to facilitate chucking of the substrate 701 and/or to influence a plasma located within the processing volume 708. The power source 709a includes a power supply, such as a DC or RF power source, and is connected to one or more electrodes of the electrostatic chuck 718. A bias source 709b may additionally or alternatively be coupled with the substrate support 706 to assist with plasma generation and/or control, such as to an edge ring assembly.

The process chamber 700 may also include a controller 795. The controller 795 includes a programmable central processing unit (CPU) 796 that is operable with a memory 797 and support circuits 798, such as power supplies, clocks, cache, input/output (I/O) circuits, and coupled to the various components of the processing system to facilitate control of the substrate processing. To facilitate control of the process chamber 700 described above, the CPU 796 may be one of any form of general purpose computer processor that can be used in an industrial setting, such as a programmable logic controller (PLC), for controlling various chambers and sub-processors. The memory 797 is coupled to the CPU 796 and the memory 797 is non-transitory and may be one or more of random access memory (RAM), read only memory (ROM), floppy disk drive, hard disk, or any other form of digital storage, local or remote. The support circuits 798 are coupled to the CPU 796 for supporting the processor.

The memory 797 is in the form of computer-readable storage media that contains instructions, when executed by the CPU 796, to facilitate the operation of the process chamber 700. The instructions in the memory 797 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CDROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

While the foregoing is directed to embodiments of the present principles, other and further embodiments of the principles may be devised without departing from the basic scope thereof.

The invention claimed is:

1. A method of processing a semiconductor substrate, comprising:
   removing material from a backside of a reconstituted substrate having a plurality of dies to expose at least one die of the plurality of dies;
   etching the backside of the reconstituted substrate to remove material from the exposed at least one die; and
   depositing a first layer of material on the backside of the reconstituted substrate and the exposed at least one die, wherein the first layer of material comprises at least one of a passivation layer, a dielectric layer, a polymer layer, an epoxy layer, or an organic layer.

2. The method of claim 1, further comprising:
   depositing a second layer of material on the backside prior to etching the backside, wherein the second layer of material is a patterned masking layer that exposes the at least one die while covering at least one additional die of the plurality of dies.

3. The method of claim 1, wherein removing material from the exposed at least one die comprises etching one of the at least one die to a final thickness of less than about 0.1 micrometers.

4. The method of claim 1, wherein the first layer of material is deposited via spin coating, spraying, or chemical vapor deposition.

5. The method of claim 1, wherein the plurality of dies include a first die and a second die, wherein the first die has a thickness different than a thickness of the second die.

6. The method of claim 1, wherein etching comprises a wet or dry etch process.

7. The method of claim 1, wherein the first layer of material is a polymer or epoxy layer.

8. The method of claim 1, wherein removing material from the backside of the reconstituted substrate comprises backgrinding or planarizing.

9. The method of claim 1, wherein the first layer has a uniform thickness.

10. A method of processing a semiconductor substrate, comprising:
    overmolding a non-active side of a first die and a second die to form a reconstituted substrate having a first side and a second side, wherein an active side of the first die and the second die face the second side;
    chemical-mechanical planarizing the first side of the reconstituted substrate to expose at least one of the first die and the second die;
    etching the first side of the reconstituted substrate to reduce a thickness of at least one of the first die and the second die, wherein a final thickness of the first die and the second die is less than about 5 micrometers; and
    depositing a first layer of material on the first side of the reconstituted substrate and the etched at least one of the first die and the second die, wherein the first layer of material comprises an organic layer.

11. The method of claim 10, further comprising:
    forming a redistribution layer on the reconstituted substrate prior to overmolding.

12. The method of claim 10, wherein the first die is thicker than the second die.

13. The method of claim 10, wherein the first layer is deposited conformally atop the first side of the reconstituted substrate.

14. A non-transitory computer readable medium for storing computer instructions that, when executed by at least one processor causes the at least one processor to perform a method comprising:
    removing material from a backside of a reconstituted substrate having a plurality of dies to expose at least one die of the plurality of dies;
    etching the backside of the reconstituted substrate to remove material from the exposed at least one die; and
    depositing a first layer of material on the backside of the reconstituted substrate and the exposed at least one die, wherein the first layer of material comprises at least one of a passivation layer, a dielectric layer, a polymer layer, an epoxy layer, or an organic layer.

15. The method of claim 14, wherein removing material from the exposed at least one die comprises etching one of the at least one die to a final thickness of less than about 0.1 micrometers.

16. The method of claim 14, wherein the first layer of material is a polymer or epoxy layer.

17. The method of claim 14, wherein the first layer of material has a substantially uniform thickness.

18. The method of claim 14, further comprising depositing a second layer of material on the backside prior to etching the backside, wherein the second layer of material is a patterned masking layer that exposes the at least one die while covering at least one additional die of the plurality of dies.

19. The method of claim 14, wherein etching comprises a wet or dry etch process.

* * * * *